(12) United States Patent
Murai et al.

(10) Patent No.: US 8,828,277 B2
(45) Date of Patent: Sep. 9, 2014

(54) NANOCOMPOSITE THERMOELECTRIC CONVERSION MATERIAL AND METHOD OF PRODUCING THE SAME

(75) Inventors: Junya Murai, Susono (JP); Takuji Kita, Numazu (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 306 days.

(21) Appl. No.: 13/377,876

(22) PCT Filed: Jun. 18, 2010

(86) PCT No.: PCT/IB2010/001533
§ 371 (c)(1),
(2), (4) Date: Dec. 13, 2011

(87) PCT Pub. No.: WO2010/146459
PCT Pub. Date: Dec. 23, 2010

(65) Prior Publication Data
US 2012/0085977 A1   Apr. 12, 2012

(30) Foreign Application Priority Data
Jun. 18, 2009   (JP) .................. 2009-145742

(51) Int. Cl.
| | | |
|---|---|---|
| *H01B 1/02* | (2006.01) | |
| *C22C 32/00* | (2006.01) | |
| *C22C 1/04* | (2006.01) | |
| *H01L 35/16* | (2006.01) | |
| *B22F 9/24* | (2006.01) | |
| *H01L 35/26* | (2006.01) | |
| *H01L 35/34* | (2006.01) | |

(52) U.S. Cl.
CPC .............. *B22F 9/24* (2013.01); *C22C 32/0015* (2013.01); *C22C 1/0491* (2013.01); *H01L 35/16* (2013.01); *H01L 35/26* (2013.01); *B22F 2998/10* (2013.01); *H01L 35/34* (2013.01); *Y10S 977/779* (2013.01)

USPC .................. 252/513; 252/519.13; 252/521.2; 136/201; 136/203; 136/205; 136/236.1; 136/238; 428/357; 977/779

(58) Field of Classification Search
USPC .......... 252/513, 519.13, 521.2; 136/201, 203, 136/205, 236.1, 238; 428/357; 977/779
See application file for complete search history.

(56) References Cited

U.S. PATENT DOCUMENTS 4,992,235 A   2/1991   Tokiai et al.
(Continued)

FOREIGN PATENT DOCUMENTS

CN   1569648 A   1/2005
(Continued)

OTHER PUBLICATIONS

International Search Report in International Application No. PCT/IB2010/001533; Mailing Date: Apr. 11, 2011.
(Continued)

*Primary Examiner* — Khanh Tuan Nguyen
(74) *Attorney, Agent, or Firm* — Finnegan, Henderson, Farabow, Garrett & Dunner, LLP

(57) ABSTRACT

A method of producing a nanocomposite thermoelectric conversion material includes preparing a solution that contains salts of a plurality of first elements constituting a thermoelectric conversion material, and a salt of a second element that has a redox potential lower than redox potentials of the first elements; precipitating the first elements, thereby producing a matrix-precursor that is a precursor of a matrix made of the thermoelectric conversion material, by adding a reducing agent to the solution; precipitating the second element in the matrix-precursor, thereby producing slurry containing the first elements and the second element, by further adding the reducing agent to the solution; and alloying the plurality of the first elements, thereby producing the matrix (70) made of the thermoelectric conversion material, and producing nanosized phonon-scattering particles (80) including the second element, which are dispersed in the matrix (70), by filtering and washing the slurry, and then, heat-treating the slurry.

4 Claims, 6 Drawing Sheets

(56) References Cited

U.S. PATENT DOCUMENTS

| | | | |
|---|---|---|---|
| 6,207,886 B1 * | 3/2001 | Kusakabe et al. | 136/201 |
| 6,261,469 B1 | 7/2001 | Zakhidov et al. | |
| 2005/0255315 A1 * | 11/2005 | Yamanaka et al. | 428/357 |
| 2005/0268956 A1 | 12/2005 | Take | |
| 2005/0284512 A1 | 12/2005 | Heremans et al. | |
| 2010/0170552 A1 | 7/2010 | Murai et al. | |
| 2010/0212328 A1 | 8/2010 | Murai et al. | |

FOREIGN PATENT DOCUMENTS

| | | | | |
|---|---|---|---|---|
| EP | 1 959 508 A1 | 8/2008 | | |
| EP | 2 154 734 A1 | 2/2010 | | |
| EP | 2 154 735 A1 | 2/2010 | | |
| EP | 2 154 736 A1 | 2/2010 | | |
| JP | 06-163996 | 6/1994 | | |
| JP | 06-204571 | 7/1994 | | |
| JP | 9-74229 | 3/1997 | | |
| JP | 10-060563 | 3/1998 | | |
| JP | 10-242535 | 9/1998 | | |
| JP | 11-97750 | 4/1999 | | |
| JP | 11-317548 | 11/1999 | | |
| JP | 2000-164940 | 6/2000 | | |
| JP | 2000-261047 | 9/2000 | | |
| JP | 2000-261048 | 9/2000 | | |
| JP | 2007-021670 | 2/2001 | | |
| JP | 2001-185767 | 7/2001 | | |
| JP | 2003-73705 | 3/2003 | | |
| JP | 2003-225743 | 8/2003 | | |
| JP | 2004-363576 | 12/2004 | | |
| JP | 2005-294478 | 10/2005 | | |
| JP | 2005-325419 | 11/2005 | | |
| JP | 2005-343782 | 12/2005 | | |
| JP | 2006-237461 | 9/2006 | | |
| JP | 2007-21670 | 2/2007 | | |
| JP | 2008-305907 | 12/2008 | | |
| JP | 2008-305919 | * 12/2008 | | H01L 35/34 |
| WO | WO 2008/041951 | 4/2008 | | |
| WO | WO 2008/150026 A1 | 12/2008 | | |

OTHER PUBLICATIONS

Written Opinion of the International Searching Authority in International Application No. PCT/IB2010/001533; Mailing Date: Apr. 11, 2011.

Applicant's Reply in International Application No. PCT/IB2010/001533 (Jul. 1, 2011).

International Search Report in International Application No. PCT/JP2008/060244; Mailing Date: Sep. 2, 2008.

Office Action dated Jul. 19, 2012 in U.S. Appl. No. 12/663,019.

Extended European Search Report for EP Appl No. 08765503.1 dated Apr. 5, 2012.

U.S. Appl. No. 12/602,820; Office Actions dated Mar. 9, 2012; May 4, 2012; and Aug. 15, 2012; Reply to Office Action filed Aug. 3, 2012.

Kim et al., "Thermal Conductivity Reduction and Thermoelectric Figure of Merit Increase by Embedding Nanoparticles in Crystalline Semiconductors," Physical Review Letters, Colum 96 Issue 4, Feb. 2, 2006, pp. 045901-1-045901-4.

* cited by examiner

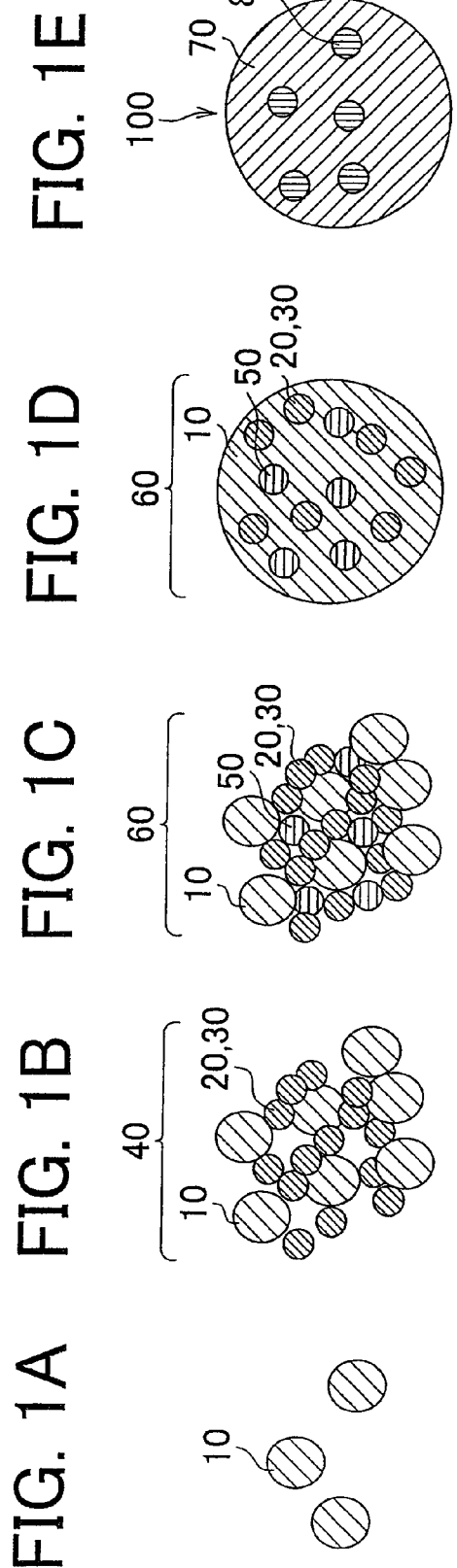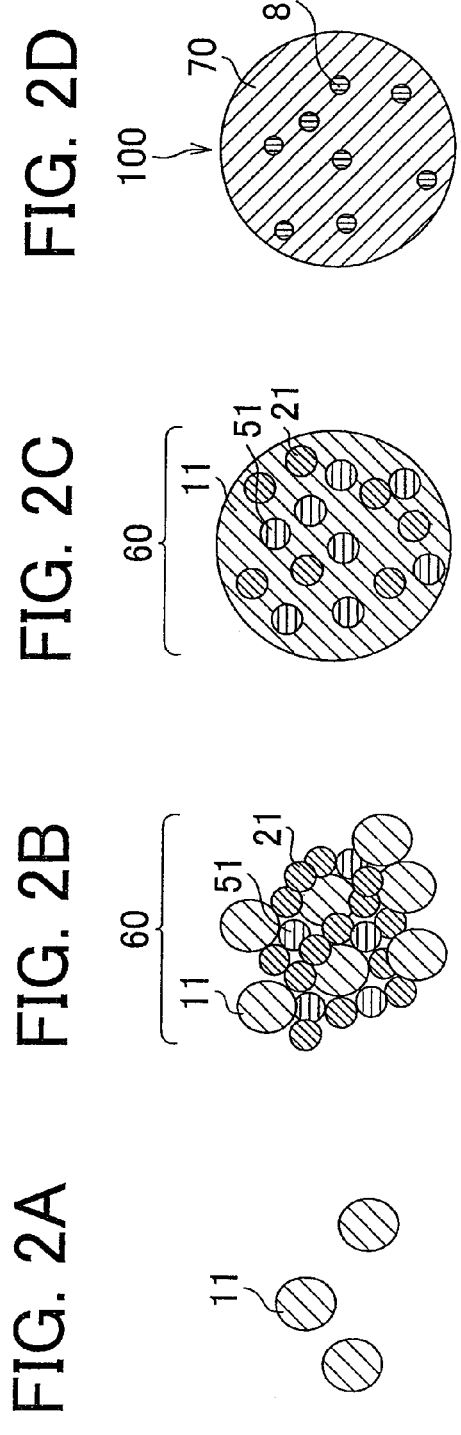

$Sb_2O_3$

I $(Co,Ni)Sb_3/10vol\%Fe_2O_3$
II $(Bi,Sb)_2Te_3/10vol\%Sb_2O_3$
III $(Bi,Sb)_2Te_3/10vol\%Te$

*2: RELATED ART

NANOCOMPOSITE THERMOELECTRIC CONVERSION MATERIAL AND METHOD OF PRODUCING THE SAME

CROSS-REFERENCE TO RELATED APPLICATIONS

This application is a national phase application of International Application No. PCT/IB 2010/001533, filed Jun. 18, 2010, and claims the priority of Japanese Application No. 2009-145742, filed Jun. 18, 2009 the contents of both of which are incorporated herein by reference.

BACKGROUND OF THE INVENTION

1. Field of the Invention

The invention relates to a method of producing a nanocomposite thermoelectric conversion material in which nano-sized phonon-scattering particles are dispersed in a matrix made of a thermoelectric conversion material, and a nanocomposite thermoelectric conversion material produced using the method.

2. Description of the Related Art

A thermoelectric conversion material is an energy material that directly converts thermal energy to electric energy, based on two basic thermoelectric effects, that is, the Seebeck effect and the Peltier effect.

A thermoelectric generation device, which uses the thermoelectric conversion material, has many advantages as compared to conventional power generation technologies. For example, the thermoelectric generation device has a simple structure, and is robust and highly durable. The thermoelectric generation device does not have a movable member. The micro-sized thermoelectric generation device is easily produced. The thermoelectric generation device does not require maintenance. The thermoelectric generation device is highly reliable, has a long lifespan, does not cause noise, and does not cause contamination. The thermoelectric generation device uses low-temperature waste heat.

A thermoelectric cooling device, which uses the thermoelectric conversion material, also has advantages as compared to conventional compression cooling technologies. For example, the thermoelectric cooling device does not require chlorofluorocarbon, and does not cause contamination. The small-sized thermoelectric cooling device is easily produced. The thermoelectric cooling device does not have a movable member, and does not cause noise.

Therefore, particularly because energy-related issues and environment-related issues have recently become more serious, it is expected that the thermoelectric conversion material will be put to practical use in fields of aerospace, national defense, construction, geological observation, weather observation, medical care, hygiene, microelectronics, and the like. Also, it is expected that the thermoelectric conversion material will be used for various purposes, for example, for the purpose of using waste heat in petrochemical industry, metallurgy, and electric power industry.

A power factor $P=S^2\sigma$, and a nondimensional performance index $ZT=(S^2\sigma/\kappa)T$ are used as indices for evaluating the performance of the thermoelectric conversion material. In this case, S represents a Seebeck coefficient, $\sigma$ represents an electric conductivity, $\kappa$ represents a thermal conductivity, and T represents an absolute temperature. That is, in order to obtain a good thermoelectric characteristic, the Seebeck coefficient S and the electric conductivity $\sigma$ need to be high, and the thermal conductivity $\kappa$ needs to be low.

To scatter phonons, which conduct heat, is effective for decreasing the thermal conductivity $\kappa$. Thus, a composite thermoelectric conversion material, in which particles used for scattering the phonons (hereinafter, referred to as "phonon-scattering particles") are dispersed in a matrix made of a thermoelectric conversion material, has been proposed.

Japanese Patent Application Publication No. 2000-164940 (JP-A-2000-164940) describes a technology in which particles of $Ag_2Te$ (that is a thermoelectric conversion material) are dispersed in a matrix made of a thermoelectric conversion material $AgBiTe_2$. The phonons are scattered by the dispersed particles, and thus, the thermal conductivity $\kappa$ is decreased. In a production method thereof, a mixture of a matrix material and the dispersed particles is molten; the dispersed particles are uniformly precipitated by maintaining the temperature of the mixture at a temperature equal to or higher than the melting point of the matrix material, and equal to or lower than the melting point of the dispersed particles; and then, the matrix is precipitated by cooling the mixture to a temperature equal to or lower than the melting point of the matrix. Accordingly, the dispersed particles are precipitated before the matrix is precipitated. Therefore, the dispersed particles are likely to agglutinate, and thus, the size of the dispersed particles is likely to be increased. As a result, the dispersibility of the dispersed particles is decreased, the effect of scattering the phonons is decreased, and the effect of decreasing the thermal conductivity is decreased.

Japanese Patent Application Publication No. 2000-261047 (JP-A-2000-261047) describes a technology in which ceramic particles are dispersed in a matrix made of a thermoelectric conversion material $CoSb_3$. In this method, however, even the smallest dispersed ceramic particles are sub-micron sized particles. Therefore, the phonons are not highly scattered. Even if the nano-sized ceramic particles were used, the nano-sized ceramic particles would be likely to agglutinate, and as a result, the dispersed particles would not be nano-sized particles.

Japanese Patent Application Publication No. 2003-73705 (JP-A-2003-73705) describes a technology in which a reducing agent is dropped into a solution containing a metal with a high reduction potential and a metal with a low reduction potential, and the metal with the high reduction potential is precipitated first, and then, the metal with the low reduction potential is precipitated. However, the publication No. 2003-73705 merely describes the fact that metals are reduced and precipitated in order of decreasing the reduction potential. The publication No. 2003-73705 does not describe a technology in which phonon-scattering particles are dispersed in a matrix made of a thermoelectric conversion material.

Japanese Patent Application Publication No. 2008-305919 (JP-A-2008-305919) describes a technology in which a solution containing salts of elements constituting a thermoelectric conversion material and a salt of a metal or an alloy is mixed with a solution containing a reducing agent. The amount of the salt of the metal or the alloy contained in the solution is excessive with respect to the amount of the metal or the alloy to be contained in the thermoelectric conversion material. Particles including the elements constituting the thermoelectric conversion material and particles including the metal or the alloy are precipitated, and heat treatment is performed. Thus, the particles including the metal or the alloy are dispersed in the matrix made of the thermoelectric conversion material. Then, sintering is performed, and thus, the particles including the metal or the alloy are integrated with the matrix. In this method, however, the particles including the elements constituting the thermoelectric conversion material of the matrix, and the phonon-scattering particles are precipitated in a mixed state. Therefore, it is not possible to prevent the agglutination of the precipitated phonon-scattering particles, and the increase in the size of the phonon-scattering particles.

SUMMARY OF THE INVENTION

The invention provides a nanocomposite thermoelectric conversion material in which nano-sized phonon-scattering particles are dispersed in a matrix made of a thermoelectric conversion material, and which has a greatly decreased thermal conductivity, and significantly improved thermoelectric conversion performance, and a method of producing the same.

A first aspect of the invention relates to a method of producing a nanocomposite thermoelectric conversion material. The method includes preparing a solution that contains salts of a plurality of first elements constituting a thermoelectric conversion material, and a salt of a second element that has a redox potential lower than redox potentials of the first elements; precipitating the first elements, thereby producing a matrix-precursor that is a precursor of a matrix made of the thermoelectric conversion material, by adding a reducing agent to the solution; precipitating the second element in the matrix-precursor, thereby producing slurry containing the first elements and the second element, by further adding the reducing agent to the solution; and alloying the plurality of the first elements, thereby producing the matrix made of the thermoelectric conversion material, and producing nano-sized phonon-scattering particles including the second element, which are dispersed in the matrix, by filtering and washing the slurry, and then, heat-treating the slurry.

A second aspect of the invention relates to a method of producing a nanocomposite thermoelectric conversion material. The method includes preparing a solution that contains salts of a plurality of first elements constituting a thermoelectric conversion material, wherein the solution contains an excessive amount of a salt of a predetermined element among the plurality of the first elements, with respect to a predetermined composition of the thermoelectric conversion material, and a redox potential of the predetermined element is not the highest among redox potentials of the plurality of the first elements; precipitating an element among the first elements, which has the redox potential higher than the redox potential of the predetermined element, by adding a reducing agent to the solution; precipitating the predetermined element, and producing slurry containing all the plurality of the first elements, by further adding the reducing agent to the solution; and producing a matrix made of the thermoelectric conversion material with the predetermined composition, and nano-sized phonon-scattering particles dispersed in the matrix, by filtering and washing the slurry, and then, heat-treating the slurry, wherein the nano-sized phonon-scattering particles include a surplus of the predetermined element with respect to the predetermined composition.

A third aspect of the invention relates to a nanocomposite thermoelectric conversion material produced by the method according to the first aspect of the invention. A fourth aspect of the invention relates to a nanocomposite thermoelectric conversion material produced by the method according to the second aspect of the invention.

According to the above-described aspects, the elements constituting the thermoelectric conversion material of the matrix are precipitated first, and particles including the elements are produced. Then, the phonon-scattering particles are precipitated among the particles including the elements constituting the matrix. Therefore, the phonon-scattering particles are not agglutinated, and the nano-size of the phonon-scattering particles is maintained. Therefore, it is possible to obtain the extremely high phonon-scattering effect. As a result, it is possible to produce the nanocomposite thermoelectric conversion material with the significantly decreased thermal conductivity.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein:

FIGS. 1A to 1E are diagrams schematically showing changes in phases due to reduction and heat treatment in a method according to a first embodiment of the invention;

FIGS. 2A to 2D are diagrams schematically showing changes in phases due to reduction and heat treatment in a method according to a second embodiment of the invention;

DETAILED DESCRIPTION OF EMBODIMENTS

Figure 3A:
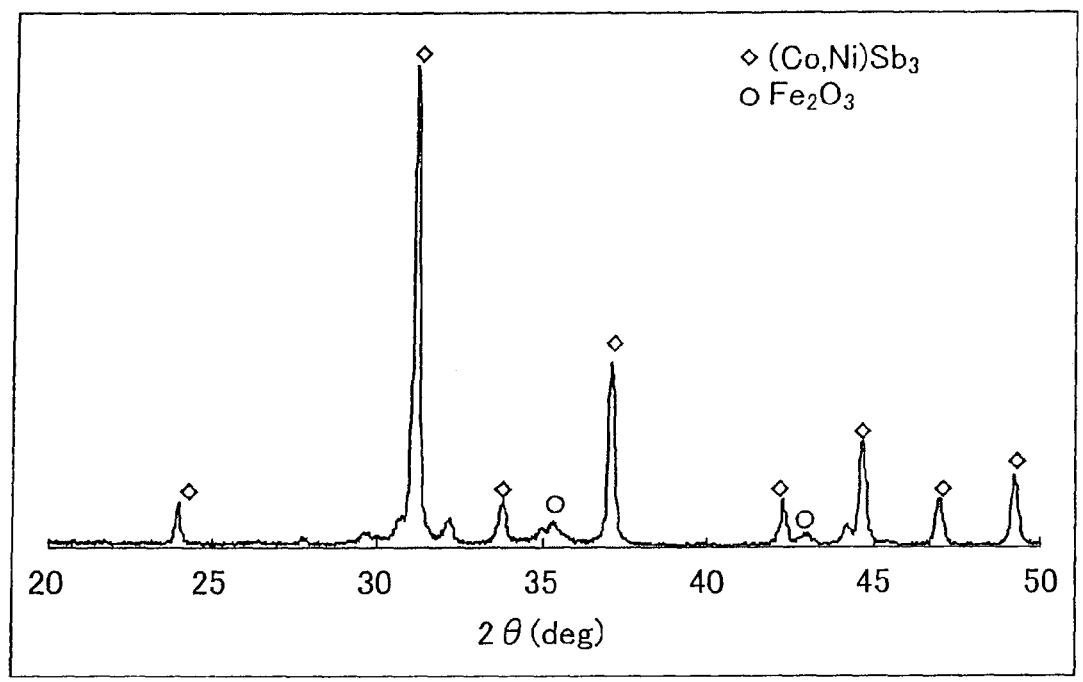
FIGS. 3A and 3B are diagrams relating to a nanocomposite thermoelectric conversion material produced in a first example (a matrix made of a thermoelectric conversion material: (Co, Ni) $Sb_3$, phonon-scattering particles: $Fe_2O_3$), FIG. 3A being an XRD chart, and FIG. 3B being a TEM image.

Changes in phases in processes of producing a nanocomposite thermoelectric conversion material according to the invention will be described with reference to FIGS. 1A to 1E and FIG. 2A to 2D.

First Embodiment

FIGS. 1A to 1E schematically show processes according to a first embodiment of the invention. The description will be made on the assumption that a nanocomposite thermoelectric conversion material, in which particles made of $Fe_2O_3$ are dispersed in a matrix made of a thermoelectric conversion material (Co, Ni) $Sb_3$, is produced. The particles made of $Fe_2O_3$ serve as particles used for scattering phonons (hereinafter, referred to as "phonon-scattering particles").

First Step

A solution, which contains salts of a plurality of first elements Co, Ni, and Sb that constitute the thermoelectric conversion material (Co, Ni) $Sb_3$, and a salt of a second element Fe that has a redox potential lower than redox potentials of the first elements, is prepared.

The redox potentials of the elements in decreasing order are as follows. The redox potential of Sb is 0.16V. The redox potential of Ni is −0.25 V. The redox potential of Co is −0.27V. The redox potential of Fe is −0.44V.

Second Step

The first elements are precipitated, and thus, a matrix-precursor, which is a precursor of the matrix made of the thermoelectric conversion material, is produced, by adding a reducing agent to the above-described solution. In this reduction process, the elements are precipitated in order of decreasing the redox potential. More specifically, first, an element 10 (Sb) with the highest redox potential among the first elements is precipitated as particles in the solution. Thus, the particles including the element 10 (i.e., Sb particles) are dispersed in the solution (FIG. 1A).

Next, elements 20 (Ni) and 30 (Co) among the first elements are precipitated in order of decreasing the redox potential. Thus, a matrix-precursor 40, which is an aggregate of the particles including the elements 10, 20, and 30 (i.e., the Sb particles, Ni particles, and Co particles), is produced (FIG. 1B).

Gaps between the particles in the matrix-precursor 40 are filled with the solution containing a second element 50 (Fe). Thus, the particles are dispersed in the entire solution.

Third Step

The second element 50 (Fe) is precipitated in the matrix-precursor 40, and thus, slurry 60 containing the first elements and the second element is produced, by further adding the above-described reducing agent to the solution in which the particles are dispersed as shown in FIG. 1C. More specifically, the particles including the second element 50 are mixture of Fe and FeOH. FIG. 1D shows the slurry 60 in a different manner. As shown in FIG. 1D, the slurry 60 includes a base including the first element 10 (Sb) with the highest redox potential among the first elements constituting the thermoelectric conversion material, and the particles including the rest of the first elements, that is, the first elements 20 and 30 (Ni and Co), and the particles including the second element 50 (Fe). The particles including the first elements 20 and 30 and the particles including the second element 50 are dispersed in the base.

Fourth Step

Next, the plurality of first elements 10, 20, and 30 (Sb, Ni, and Co) are alloyed, and thus, a matrix 70 including the thermoelectric conversion material (Co, Ni) $Sb_3$ is produced, and nano-sized phonon-scattering particles 80 including the second element 50, which are dispersed in the matrix 70, are produced, by filtering and washing the slurry 60, and then, heat-treating the slurry 60. Fe or FeOH of the particles including the second element 50 is oxidized, and thus, the phonon-scattering particles 80 made of iron oxide $Fe_2O_3$ are produced. That is, the phonon-scattering particles 80 are made of oxide of the second element 50.

As described above, the particles including the second element 50 are precipitated in the gaps in the matrix-precursor 40. Therefore, each of the precipitated particles including the second element 50 is restrained by the matrix-precursor 40, and thus, the particles including the second element 50 are not agglutinated. Accordingly, the size of the particles including the second element 50 remains the same as the nano-size of the particles including the second element 50 when precipitated from the solution.

Thus, a nanocomposite thermoelectric conversion material 100, in which the nano-sized phonon-scattering particles 80 are dispersed in the matrix 70 including thermoelectric conversion material, is produced.

Examples of the nanocomposite thermoelectric conversion material, which are appropriately produced by the method according to the first embodiment of the invention, include $(Bi, Sb)_2 (Te; Se)_3$-based nanocomposite thermoelectric conversion materials, PbTe-based nanocomposite thermoelectric conversion materials, $CoSb_3$-based nanocomposite thermoelectric conversion materials, SiGe-based nanocomposite thermoelectric conversion materials, ZnSb-based nanocomposite thermoelectric conversion materials, FeSi-based nanocomposite thermoelectric conversion materials, and BiSb-based nanocomposite thermoelectric conversion materials.

Second Embodiment

FIGS. 2A to 2D schematically show processes according to a second embodiment of the invention. The description will be made on the assumption that a nanocomposite thermoelectric conversion material, in which particles made of $Sb_2O_3$ are dispersed in a matrix made of a thermoelectric conversion material $(Bi, Sb)_2Te_3$, is produced. The particles made of $Sb_2O_3$ serve as phonon-scattering particles.

First Step

A solution, which contains salts of a plurality of first elements Bi, Sb, and Te that constitute the thermoelectric conversion material $(Bi, Sb)_2Te_3$, is prepared. The solution contains an excessive amount of the salt of a predetermined element (Sb) among the plurality of the first elements, with respect to a predetermined composition of the thermoelectric conversion material, and the redox potential of the predetermined element (Sb) is not the highest among the redox potentials of the first elements (Te has the highest redox potential).

In this case, the redox potentials of the elements in decreasing order are as follows. The redox potential of Te is 0.53V. The redox potential of Sb is 0.16 V. The redox potential of Bi is 0.16V. The solution may contain an excessive amount of Bi, instead of containing an excessive amount of Sb.

Second Step

The element among the first elements, which has the redox potential higher than the redox potential of the predetermined element, is precipitated by adding a reducing agent to the above-described solution. More specifically, first, the element 11 (Te) with the highest redox potential among the first elements is precipitated as particles in the solution. Thus, the particles including the element 11 (i.e., Te particles) are dispersed in the solution (FIG. 2A).

Third Step

The predetermined element 51 (Sb) is precipitated by further adding the above-described reducing agent to the solution in which the particles are dispersed. In the assumed case, the predetermined element 51 is Sb. However, Bi, which has the redox potential equal to the redox potential of Sb, is simultaneously precipitated to produce particles including the element 21 (i.e., Bi particles). Thus, slurry 60 containing all the plurality of the first elements Te, Bi, and Sb is produced as shown in FIG. 2B. FIG. 2C shows the slurry 60 in a different manner. As shown in FIG. 2C, the slurry 60 includes a base including the element 11 (Te) with the highest redox potential among the first elements constituting the thermoelectric conversion material, and the particles including the rest of the first elements, that is, the particles including the first elements 21 and 51 (Bi and Sb). The particles including the first elements 21 and 51 are dispersed in the base.

Fourth Step

Next, a matrix 70 including the thermoelectric conversion material with a predetermined composition (Bi, Sb)$_2$Te$_3$ is produced due to alloying, and nano-sized phonon-scattering particles 80 dispersed in the matrix 70 are produced, by filtering and washing the slurry 60, and then, heat-treating the slurry 60. The nano-sized phonon-scattering particles 80 include a surplus of the predetermined element 51 with respect to the predetermined composition. At this time, part of the predetermined element 51 is incorporated into the predetermined composition to produce the matrix 70 including the thermoelectric conversion material. During the heat treatment, the surplus of the predetermined element 51 is oxidized, and thus, particles made of oxide of the predetermined element 51 (i.e., particles made of antimony oxide Sb$_2$O$_3$), which serve as phonon-scattering particles 80, are produced. That is, the phonon-scattering particles 80 are made of oxide of the predetermined element 51.

Thus, the predetermined element 51 is precipitated in the matrix 70. Therefore, each of the precipitated particles including the predetermined element 51 is restrained by the matrix 70, and thus, the particles including the predetermined element 51 are not agglutinated. Accordingly, the size of the particles including the predetermined element 51 remains the same as the nano-size of the particles including the predetermined element 51 when precipitated from the solution.

Thus, a nanocomposite thermoelectric conversion material 100, in which the nano-sized phonon-scattering particles 80 are dispersed in the matrix 70 including the thermoelectric conversion material, is produced.

Examples of the nanocomposite thermoelectric conversion material, which are appropriately produced by the method according to the second embodiment of the invention, include (Bi, Sb)$_2$ (Te, Se)$_3$-based nanocomposite thermoelectric conversion materials, PbTe-based nanocomposite thermoelectric conversion materials, CoSb$_3$-based nanocomposite thermoelectric conversion materials, SiGe-based nanocomposite thermoelectric conversion materials, ZnSb-based nanocomposite thermoelectric conversion materials, FeSi-based nanocomposite thermoelectric conversion materials, and BiSb-based nanocomposite thermoelectric conversion materials.

EXAMPLES

First Example

The nanocomposite thermoelectric conversion material, in which 10 vol % of Fe$_2$O$_3$ particles were dispersed in the matrix made of the thermoelectric conversion material (Co, Ni) Sb$_3$, was produced according to a procedure described below on a condition described below, using the method according to the first embodiment of the invention. The Fe$_2$O$_3$ particles served as phonon-scattering particles.

Preparation of a Source Material Solution

A source material solution was prepared by dissolving source materials described below, in 100 ml of ethanol.

The source materials for the matrix were 2.75 g of antimony chloride (SbCl$_3$), 0.9 g of cobalt chloride hexahydrate (CoCl$_2$ 6H$_2$O), and 0.057 g of nickel chloride hexahydrate (NiCl$_2$ 6H$_2$O). The source material for the dispersed particles was 0.335 g of ferric chloride hexahydrate (FeCl$_3$ 6H$_2$O).

Reduction

A solution, which was produced by dissolving 2.4 g of NaBH$_4$, which served as a reducing agent, in 100 ml of ethanol, was dropped into the above-described source material solution. Ethanol slurry containing nano particles precipitated by reduction was filtered and washed using a solution produced by mixing 500 ml of water and 300 ml of ethanol, and further, the slurry was filtered and washed using 300 ml of ethanol.

Heat Treatment

Then, the slurry was placed in a hermetically-sealed autoclave device, and the alloy matrix was produced by performing hydrothermal treatment at 240° C. for 48 hours. Then, drying was performed in an N$_2$ gas flow atmosphere, and powder was collected. At this time, approximately 2.0 g of powder was collected.

Sintering

Spark plasma sintering (SPS) was performed on the collected powder at 500° C. Thus, the nanocomposite thermoelectric conversion material, in which 10 vol % of Fe$_2$O$_3$ particles were dispersed in the matrix made of the thermoelectric conversion material (Co, Ni) Sb$_3$, was produced. The Fe$_2$O$_3$ particles served as the phonon-scattering particles.

Observation of Constituent Phases

Figure 3B:
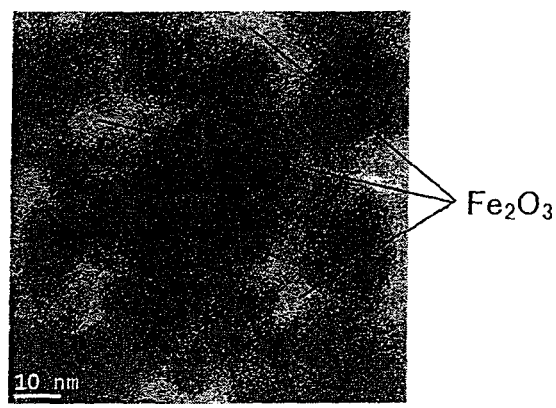

The produced powder was analyzed and observed by XRD analysis and TEM observation. FIG. 3A shows an XRD chart, and FIG. 3B shows a TEM image. As shown in the XRD chart, diffraction peaks of (Co, Ni) Sb$_3$ (indicated by rhombus marks in FIG. 3A) and diffraction peaks of Fe$_2$O$_3$ (indicated by circles in FIG. 3A) were clearly observed. Thus, it was confirmed that the nanocomposite thermoelectric conversion material included both of the phase of (Co, Ni) Sb$_3$ and the phase of Fe$_2$O$_3$. Also, the dispersed Fe$_2$O$_3$ particles with the average diameter of 19 nm were observed in the TEM image.

Performance

Table 1 shows the measured Seebeck coefficient, the measured specific resistance, the measured thermal conductivity, and the measured nondimensional performance index ZT at 400° C. Further, for the purpose of comparison, Table 1 shows values that are considered to be best values obtained in a thermoelectric conversion material (Co, Ni) Sb$_3$ with a single phase, in which there is no phonon-scattering particle, in a conventional example. The values are described in a publication (*1). It is evident from Table 1 that the thermal conductivity of the nanocomposite thermoelectric conversion material according to the invention is 0.7 (W/m/K) that is one-fifth of the thermal conductivity of the thermoelectric conversion material in the conventional example. Also, it is evident from Table 1 that the nondimensional performance index ZT of the nanocomposite thermoelectric conversion material according to the invention is 1.33 that is more than 2.5 times the nondimensional performance index ZT of the thermoelectric conversion material in the conventional example, and thus, the nondimensional performance index ZT of the nanocomposite thermoelectric conversion material according to the invention is significantly improved.

TABLE 1

| | Seebeck coefficient (μV/K) | Specific resistance (μΩm) | Thermal conductivity (W/m/K) | ZT |
| --- | --- | --- | --- | --- |
| First example | −204 | 30 | 0.7 | 1.33 |
| Conventional example (*1) | −200 | 15 | 3.5 | 0.5 |

The cited related art is described in the publication (*1) "Katsuyama S., Watanabe M., Kuroki M. et al, Journal of Applied Physics, volume 93, Issue 5, pp2758-2764 (2003)". In a production method described in the publication, (1) Co, Ni, Sb are sealed in quartz, heated and molten, and mixed to produce an alloy; (2) the alloy is subjected to mechanical alloying, that is, the alloy is fractured; and (3) sintering is performed using a hot press.

Second Example

The nanocomposite thermoelectric conversion material, in which 10 vol % of $Sb_2O_3$ particles were dispersed in the matrix made of the thermoelectric conversion material (Bi, Sb)$_2$Te$_3$, was produced according to a procedure described below on a condition described below, using the method according to the second embodiment of the invention. The $Sb_2O_3$ particles served as phonon-scattering particles.

Preparation of a Source Material Solution

A source material solution was prepared by dissolving source materials described below, in 100 ml of ethanol. The source materials for the matrix were 0.4 g of bismuth chloride (BiCl$_3$), and 2.56 g of tellurium chloride (TeCl$_4$). The source material used for producing the matrix and the dispersed particles was 1.5 g of antimony chloride (SbCl$_3$).

Reduction

A solution, which was produced by dissolving 2.4 g of NaBH$_4$, which served as a reducing agent, in 100 ml of ethanol, was dropped into the above-described source material solution. Ethanol slurry containing nano particles precipitated by reduction was filtered and washed using a solution produced by mixing 500 ml of water and 300 ml of ethanol, and further, the slurry was filtered and washed using 300 ml of ethanol.

Heat Treatment

Then, the slurry was placed in a hermetically-sealed autoclave device, and the alloy matrix was produced by performing hydrothermal treatment at 240° C. for 48 hours. Then, drying was performed in an N$_2$ gas flow atmosphere, and powder was collected. At this time, approximately 2.0 g of powder was collected.

Sintering

Spark plasma sintering (SPS) was performed on the collected powder at 360° C. Thus, the nanocomposite thermoelectric conversion material, in which 10 vol % of $Sb_2O_3$ particles were dispersed in the matrix made of the thermoelectric conversion material (Bi, Sb)$_2$Te$_3$, was produced. The $Sb_2O_3$ particles served as the phonon-scattering particles.

Observation of Constituent Phases

Figure 4A:
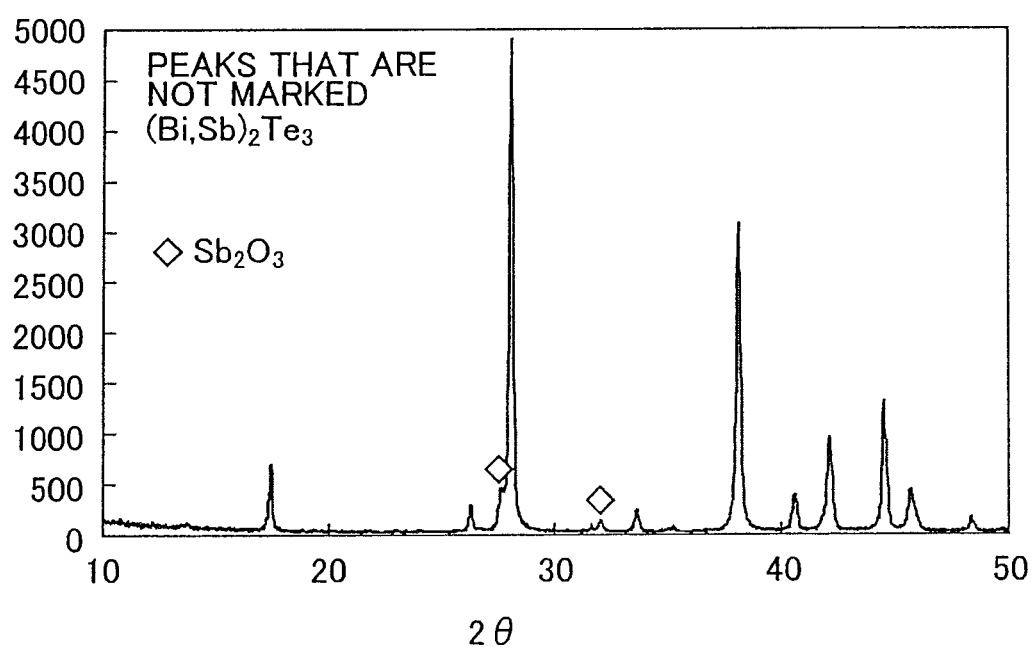
FIGS. 4A to 4D are diagrams relating to a nanocomposite thermoelectric conversion material produced in a second example (a matrix made of a thermoelectric conversion material: $(Bi, Sb)_2Te_3$, phonon-scattering particles: $Sb_2O_3$), FIG. 4A being an XRD chart, FIG. 4B being an EELS oxygen mapping image, FIG. 4C being an TEM image showing the nanocomposite thermoelectric conversion material before heat treatment, and FIG. 4D being an TEM image showing the nanocomposite thermoelectric conversion material after heat treatment.
Figure 4B:
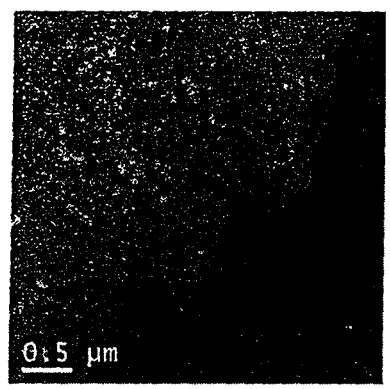
Figures 4C, 4D:
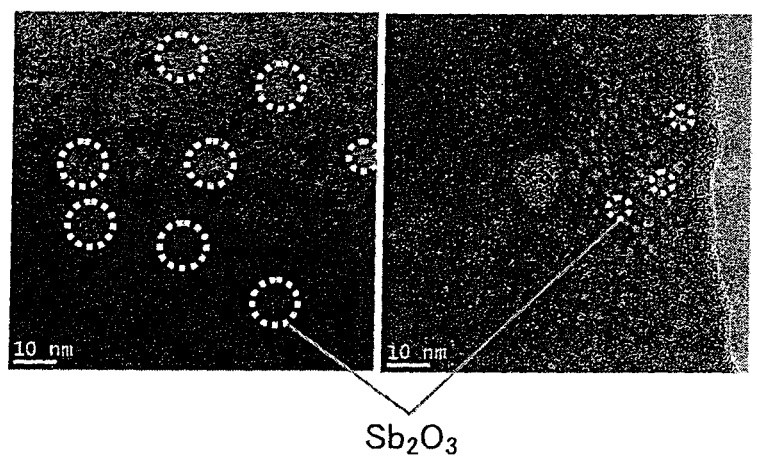

The produced powder was analyzed and observed by XRD analysis, EELS oxygen mapping, and TEM observation. FIG. 4A shows an XRD chart, and FIG. 4B shows an EELS oxygen mapping image. FIG. 4C shows a TEM image before heat treatment, and FIG. 4D shows a TEM image after heat treatment. As shown in the XRD chart, diffraction peaks of (Bi, Sb)$_2$Te$_3$ (that are not marked in FIG. 4A) and diffraction peaks of $Sb_2O_3$ (indicated by rhombus marks in FIG. 4A) were clearly observed. Thus, it was confirmed that the nanocomposite thermoelectric conversion material included both of the phase of (Bi, Sb)$_2$Te$_3$ and the phase of $Sb_2O_3$. In the EELS oxygen mapping image, oxygen, which was contained only in $Sb_2O_3$, was observed as white spots. The average particle diameter was 10 nm in the TEM image before heat treatment (FIG. 4C), and the average particle diameter was 7 nm in the TEM image after heat treatment (FIG. 4D). Thus, it was evident that the size of the particles was decreased after heat treatment. Thus, the phonon-scattering efficiency is further improved, and the thermal conductivity is further decreased.

Figure 5B:
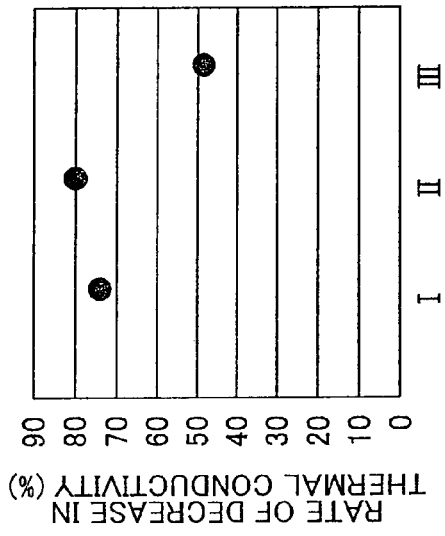
FIGS. 5A to 5C are diagrams relating to the nanocomposite thermoelectric conversion materials in the first example and the second example, FIG. 5A being a graph showing average diameters of phonon-scattering particles, FIG. 5B being a graph showing rates of decrease in a thermal conductivity, and FIG. 5C being a graph showing nondimensional performance indices ZT and values in related art described in a publication for comparison.
Figure 5C:
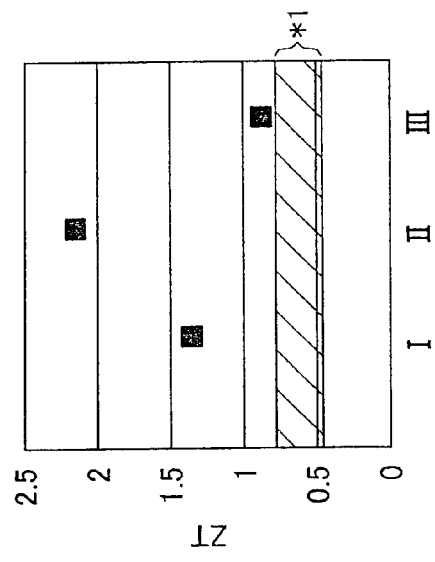
Figure 5A:
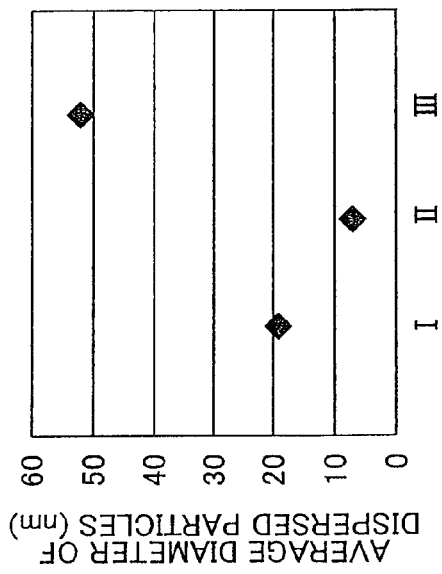

FIGS. 5A to 5C are diagrams relating to the nanocomposite thermoelectric conversion materials in the first example and the second example. FIG. 5A shows average diameters of phonon-scattering particles, FIG. 5B shows rates of decrease in the thermal conductivity, and FIG. 5C shows nondimensional performance indices ZT. For the purpose of comparison, FIG. 5C also shows the ZT values that are considered to be the best values in the conventional example. The values are described in the above-described publication (*1). In FIG. 5A to 5C, I, II, and III in the abscissa axis indicate samples described below.

Samples

In FIG. 5A to 5C, I indicates the nanocomposite thermoelectric conversion material in the first example, which included the matrix made of (Co, Ni) Sb$_3$, and the dispersed particles made of Fe$_2$O$_3$ (10 vol %). II indicates the nanocomposite thermoelectric conversion material in the second example, which included the matrix made of (Bi, Sb) Te$_3$, and the dispersed particles made of $Sb_2O_3$ (10 vol %). III indicates the nanocomposite thermoelectric conversion material in a comparative example, which included the matrix made of (Bi, Sb) Te$_3$ and the dispersed particles made of Te (10 vol %). The nanocomposite thermoelectric conversion material in the comparative example was the same as the nanocomposite thermoelectric conversion material in the second example, except that the amount of Te was excessive with respect to the predetermined composition, instead of the amount of Sb. "*1" indicates the thermoelectric conversion material (Co, Ni) Sb$_3$ with a single phase in the conventional example (described in the publication *1).

As shown in FIG. 5A, the average diameter of the dispersed particles in the first example indicated by I was 19 nm, and the average diameter of the dispersed particles in the second example indicated by II was 7 nm. Thus, the size of the dispersed particles was significantly decreased. In the comparative example indicated by III, the excessive amount of Te with respect to the predetermined composition was used, and the particles including Te were dispersed as the phonon-scattering particles. Te has the highest redox potential among the constituent elements Bi, Sb, and Te. In this case, because Te was precipitated first during the reduction process, the particles including Te agglutinated and the size of the particles was increased. Therefore, the average diameter of the particles was 53 nm, which was much larger than the average diameters in the first example indicated by I and the second example indicated by II. As a result, in the comparative example, the phonon-scattering effect was small. As shown in FIG. 5B, the rate of decrease in the thermal conductivity in the comparative example indicated by III with respect to the conventional example was 48%, which was low, while the rate of decrease in the thermal conductivity in the first example indicated by I with respect to the conventional example was 74%, and the rate of decrease in the thermal conductivity in the second example indicated by II with respect to the conventional example was 80%.

As shown in FIG. 5C, the nondimensional performance index ZT in the first example indicated by I (the average diameter: 19 nm) was 1.33, and the nondimensional performance index ZT in the second example indicated by II (the average diameter: 7 nm) was 2.2, while the nondimensional performance index ZT in the conventional example indicated by "*1" was approximately 0.4 to 0.7. Thus, the nondimensional performance index ZT in the first example and the nondimensional performance index ZT in the second example were significantly improved. The nondimensional performance index ZT in the comparative example indicated by III (the average diameter: 53 nm) was slightly higher than the nondimensional performance index ZT of the thermoelectric conversion material that did not include the phonon-scattering particles in the conventional example. However, the nondimensional performance index ZT in the comparative example was lower than the nondimensional performance index ZT in the first example indicated by I and the nondimensional performance index ZT in the second example indicated by II.

Figure 6A:
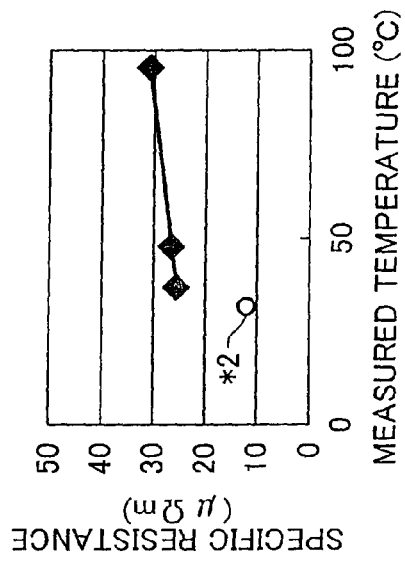
FIGS. 6A to 6D are diagrams relating to the nanocomposite thermoelectric conversion material in the second example, FIG. 6A being a graph showing a Seebeck coefficient with respect to a measured temperature and a value in related art described in a publication for comparison, FIG. 6B being a graph showing a specific resistance with respect to the measured temperature and a value in related art described in the publication for comparison, FIG. 6C being a graph showing the thermal conductivity with respect to the measured temperature and a value in related art described in the publication for comparison, and FIG. 6D being a graph showing a nondimensional performance index ZT with respect to the measured temperature and a value in related art described in the publication for comparison.
Figure 6B:
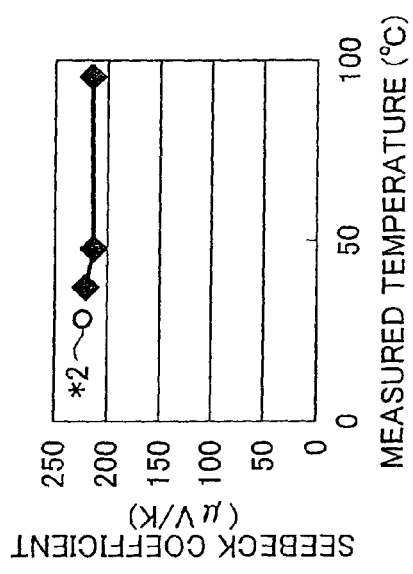
Figure 6C:
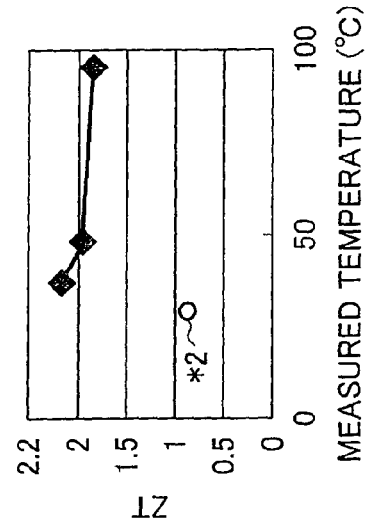
Figure 6D:
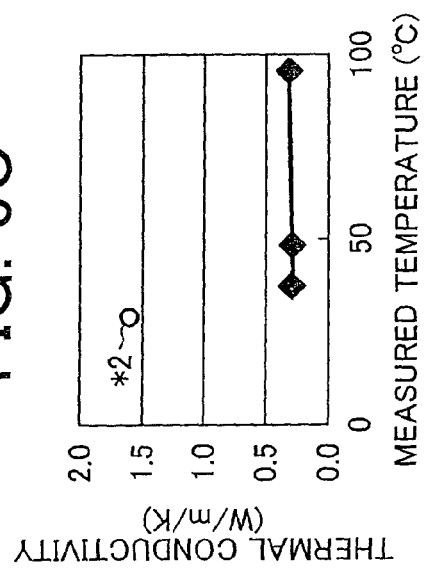

FIGS. 6A to 6D are diagrams relating to the nanocomposite thermoelectric conversion material in the second example. FIG. 6A is the graph showing the Seebeck coefficient with respect to measured temperature. FIG. 6B is the graph showing the specific resistance with respect to the measured temperature. FIG. 6C is the graph showing the thermal conductivity with respect to the measured temperature. FIG. 6D is the graph showing the nondimensional performance index ZT with respect to the measured temperature. For the purpose of comparison, FIGS. 6A to 6D also show values in related art described in a publication (*2).

As shown in FIG. 6C, the thermal conductivity was substantially constant, and approximately 0.3 W/m/K, which was extremely low, in the range of the measured temperatures, regardless of the measured temperature, while the thermal conductivity in the related art was 1.57 W/m/K. Accordingly, as shown in FIG. 6D, the nondimensional performance index ZT was 2.2 to 1.8, which was extremely high, while the nondimensional performance index ZT in the related art was 0.8. As the specific resistance shown in FIG. 6B was slightly increased due to the increase in the measured temperature, the nondimensional performance index ZT was slightly decreased (from 2.2 to 1.8).

The cited related art (*2) is described in "P. M. Rowe, CRC Handbook, p213-214 (Production method), and p227-235 (Material performance)". In a production method described in the publication, (1) a polycrystal with a stoichiometric composition is placed in a quartz ampule; (2) the ampule is moved to pass through a heater; (3) the polycrystal is molten in the ampule when the ampule passes through the heater, and the melt is solidified to a solid after the ampule passes through the heater. As a result, a single crystal is produced.

According to the invention, it is possible to provide the nanocomposite thermoelectric conversion material in which the nano-sized phonon-scattering particles are dispersed in the matrix made of the thermoelectric conversion material, and which has the greatly decreased thermal conductivity, and the significantly improved thermoelectric conversion performance, and the method of producing the same.

The invention claimed is:

1. A method of producing a nanocomposite thermoelectric conversion material, comprising:
    preparing a solution that contains salts of a plurality of first elements constituting a thermoelectric conversion material, and a salt of a second element that has a redox potential lower than redox potentials of the first elements;
    precipitating the first elements, thereby producing a matrix-precursor that is a precursor of a matrix made of the thermoelectric conversion material, by adding a reducing agent to the solution;
    precipitating the second element in the matrix-precursor, thereby producing slurry containing the first elements and the second element, by further adding the reducing agent to the solution; and
    alloying the plurality of the first elements, thereby producing the matrix made of the thermoelectric conversion material, and producing nano-sized phonon-scattering particles including the second element, which are dispersed in the matrix, by filtering and washing the slurry, and then, heat-treating the slurry,
    wherein the phonon-scattering particles are made of $Fe_2O_3$.

2. The method according to claim 1, wherein
    the slurry includes a base including an element with the highest redox potential among the first elements, and particles including a rest of the first elements and particles including the second element; and
    the particles including the rest of the first elements and the particles including the second element are dispersed in the base.

3. The method according to claim 1, wherein
    the first elements are Sb, Ni, and Co, the second element is Fe, and the thermoelectric conversion material is (Co, Ni) $Sb_3$.

4. The method according to claim 1, wherein the phonon-scattering particles are made of oxide of the second element, wherein the second element is Fe.

* * * * *